United States Patent
Morimoto et al.

[11] Patent Number: 5,104,828
[45] Date of Patent: Apr. 14, 1992

[54] METHOD OF PLANARIZING A DIELECTRIC FORMED OVER A SEMICONDUCTOR SUBSTRATE

[75] Inventors: Seiichi Morimoto, Robert J. Patterson, both of Beaverton, Oreg.

[73] Assignee: Intel Corporation, Santa Clara, Calif.

[21] Appl. No.: 487,418

[22] Filed: Mar. 1, 1990

[51] Int. Cl.$^5$ .................. H01L 21/302; H01L 21/463
[52] U.S. Cl. ............................. 437/225; 437/235; 437/238; 148/DIG. 7; 156/635; 156/636; 156/645; 51/131.3; 51/131.4; 51/132; 51/165.73; 51/165.73; 51/165.76
[58] Field of Search ............... 437/225, 238, 235; 148/DIG. 17; 156/645, 635, 636; 51/131.3, 131.4, 132, 165.72, 165.75, 165.76, 322, 356

[56] References Cited

U.S. PATENT DOCUMENTS

| | | | |
|---|---|---|---|
| 3,615,955 | 10/1971 | Regh et al. | 156/636 |
| 4,256,535 | 12/1979 | Banks . | |
| 4,313,284 | 2/1982 | Walsh | 51/131.4 |
| 4,450,652 | 5/1984 | Walsh | 51/131.4 |
| 4,879,258 | 11/1989 | Fisher | 437/225 |

FOREIGN PATENT DOCUMENTS

| | | |
|---|---|---|
| 0188756 | 12/1985 | European Pat. Off. . |
| 1319882 | 10/1971 | United Kingdom . |
| 2072550 | 3/1981 | United Kingdom . |
| 2104809 | 9/1982 | United Kingdom . |

Primary Examiner—Olik Chaudhuri
Assistant Examiner—Kevin Picardat
Attorney, Agent, or Firm—Blakely, Sokoloff, Taylor & Zafman

[57] ABSTRACT

An improved method for planarizing the surface of an dielectric deposited over a semiconductor substrate. The substrate is pressed face down against a table which has been coated with an abrasive material. In this way, the upper surface of the interlayer dielectric contacts the abrasive. Rotational movement of the wafer relative to the table facilitates removal of the protruding portions of the interlayer dielectric by the abrasive. Post-planarization step height variation is minimized by simultaneously cooling the table and the abrasive material during the abrasive or polishing process. By maintaining the table and the abrasive at about 10 degrees Celsius the step height variation is reduced by a factor of 2 over that normally realized in the prior art.

13 Claims, 4 Drawing Sheets

FIG_1 (PRIOR ART)
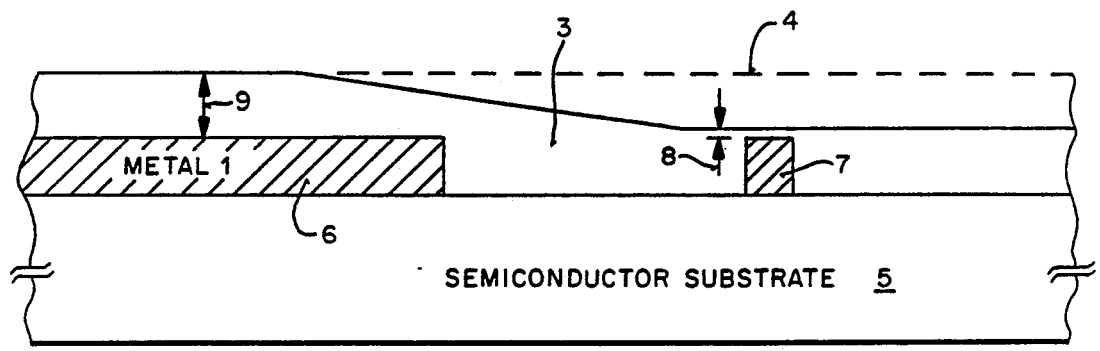
FIG_2
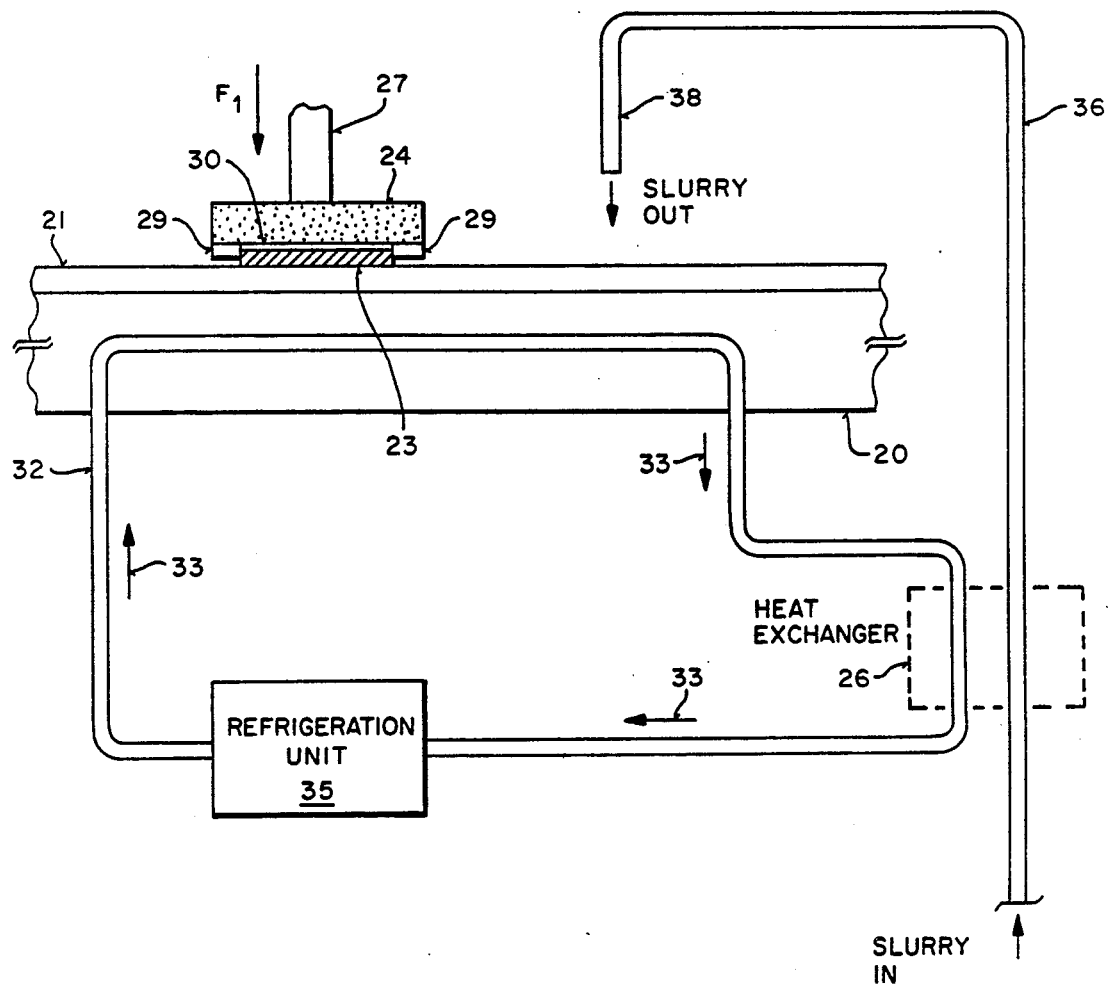

FIG_3
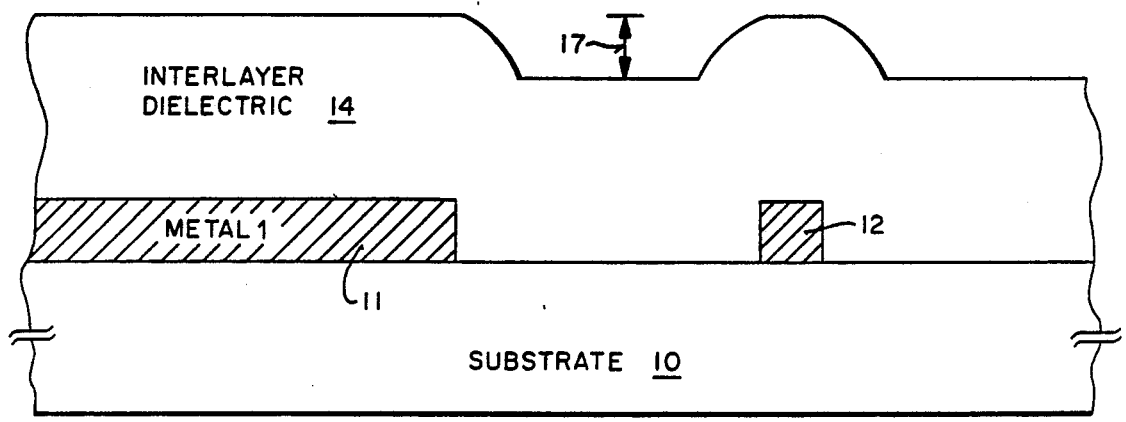
FIG_4
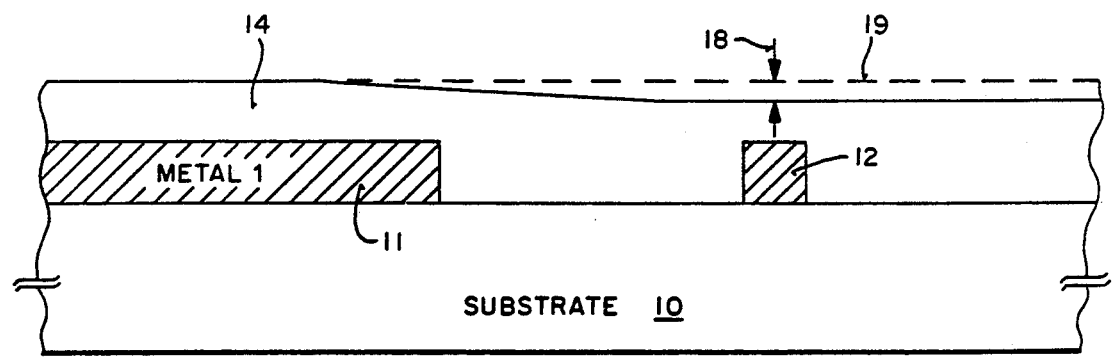

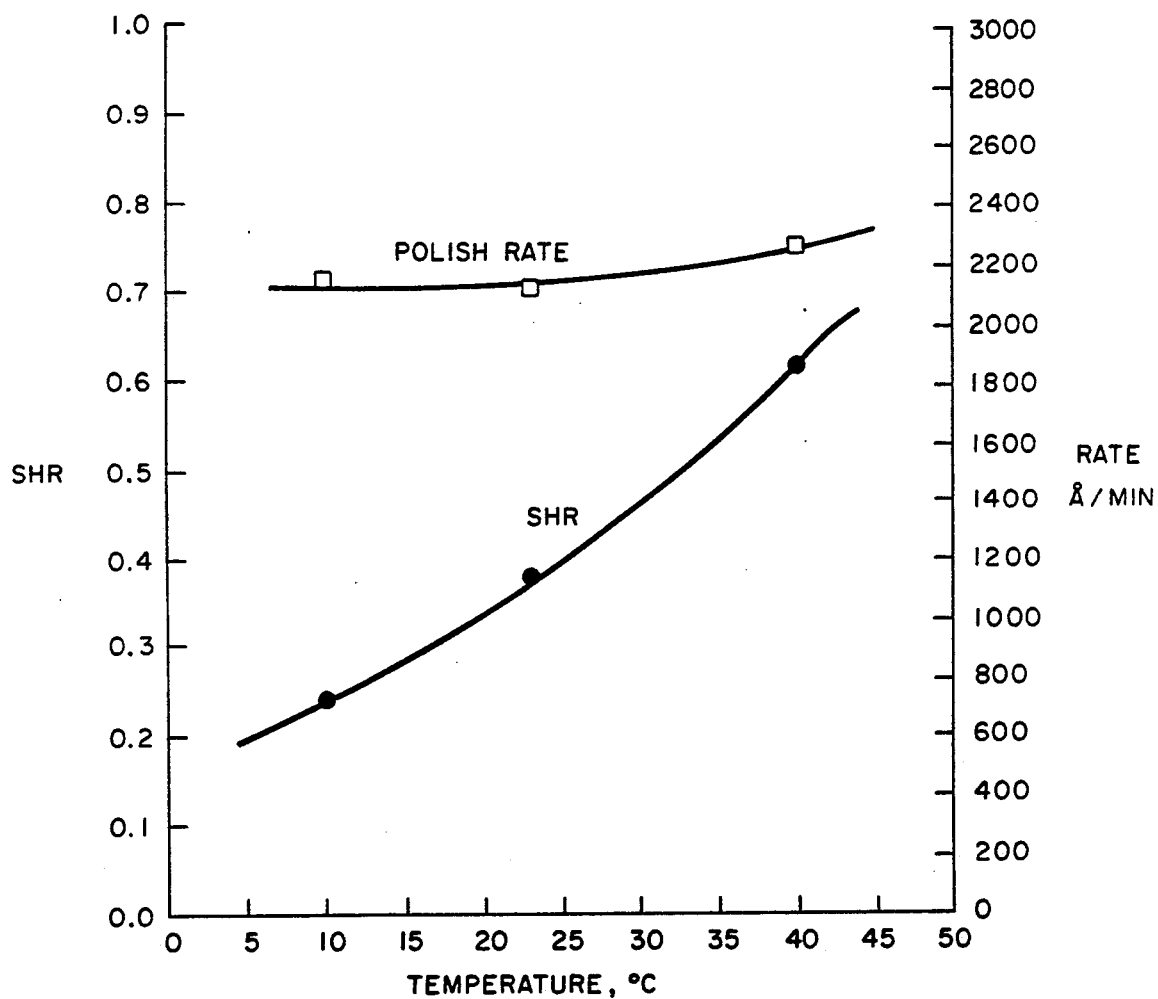
FIG_5

FIG_6
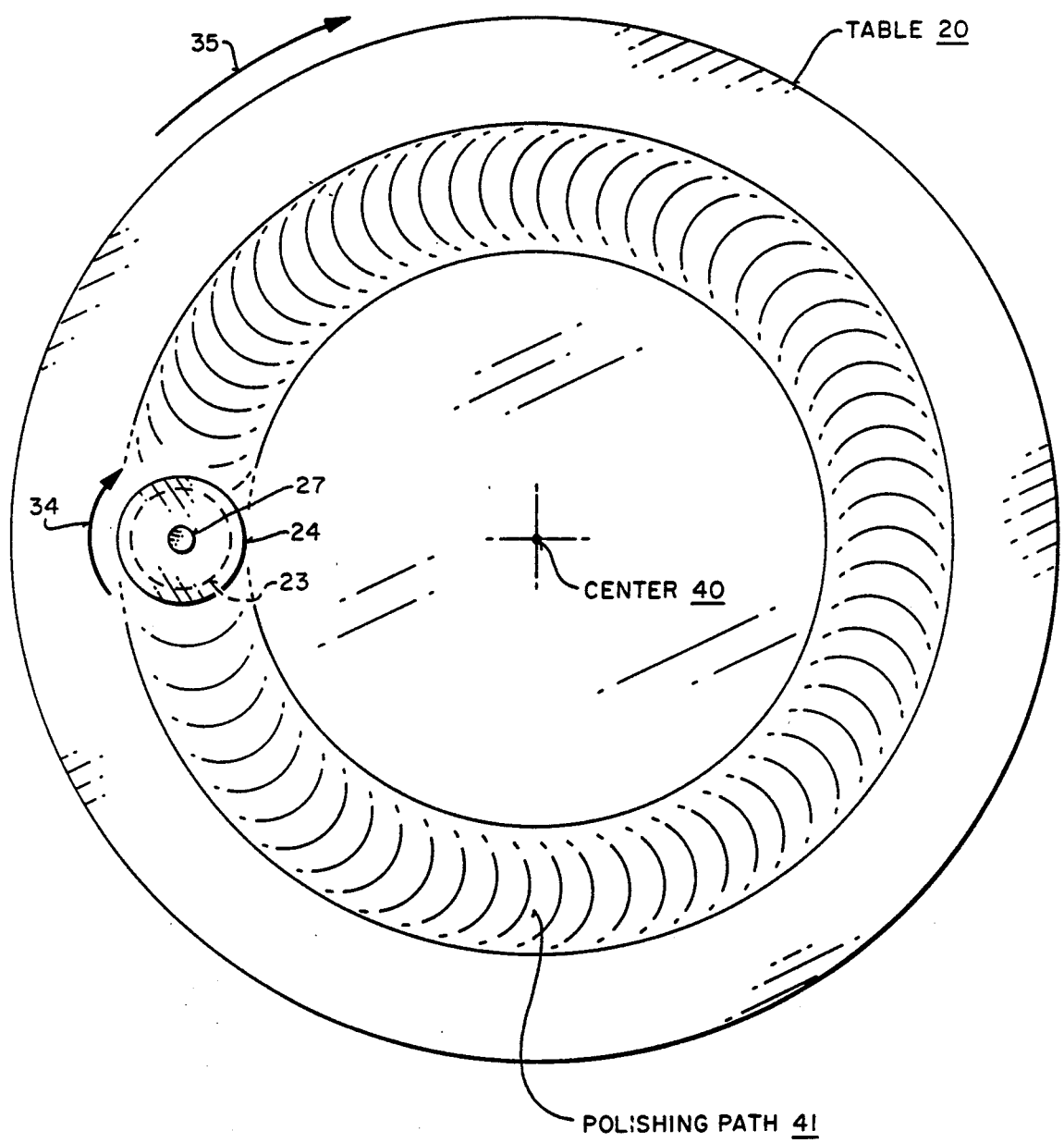

METHOD OF PLANARIZING A DIELECTRIC FORMED OVER A SEMICONDUCTOR SUBSTRATE

FIELD OF THE INVENTION

This invention relates to the field of semiconductor processing; more specifically, to polishing methods for planarizing dielectric layers formed over a semiconductor substrate.

BACKGROUND OF THE INVENTION

Every integrated circuit (IC) manufactured today relies upon an elaborate system of metallized interconnects to couple together the various devices which are fabricated in the semiconductor substrate. The technology for forming these metallized interconnects is extremely sophisticated and well-understood. Usually, aluminum or some other metal, is deposited and then patterned to form interconnect paths along the surface of the substrate material. In most processes, an insulative layer is then deposited over this first metal (metal 1) layer. Via openings are then etched through the insulative layer and a second metalization layer is deposited. The second metal (metal 2) layer covers the insulative layer and fills the via openings down to the metal 1 layer. The purpose of the dielectric layer, of course, is to act as an insulator between the metal 1 and metal 2 interconnects.

In many ICs, the interlayer dielectric comprises a chemical vapor deposition (CVD) of silicon dioxide. The silicon dioxide layer is normally formed to a thickness of approximately one micron. The underlying metal 1 layer is also formed to a thickness of approximately one micron. This silicon dioxide layer covers the metal 1 interconnects conformably such that the upper surface of the silicon dioxide layer is characterized by a series of non-planar steps which correspond in height and width to the underlying metal 1 lines.

These step height variations in the upper surface of the interlayer dielectric have several undesirable features. First, a non-planar dielectric surface interferes with the optical resolution of subsequent photolithographic processing steps. This makes it extremely difficult to print high resolution lines. A second problem involves the step coverage of the metal 2 layer over the interlayer dielectric. If the step height is too large there is a serious danger that open circuits will be formed in the metal 2 layer.

To combat these problems, various techniques have been developed in an attempt to better planarize the upper surface of the interlayer dielectric. One approach employs abrasive polishing to remove the protruding steps along the upper surface of the dielectric. According to this method, the silicon substrate is placed face-down on a table coated with an abrasive material. Both the wafer and the table are then rotated relative to each other in an abrasive fashion to remove the protruding portions. This abrasive polishing process continues until the upper surface of the dielectric layer is largely flattened. In certain processes, polishing is performed at an elevated temperature (i.e., higher than room or ambient temperatures).

While the abrasive polishing process greatly improves the overall flatness of the dielectric surface, there are certain drawbacks. Instead of producing a completely planar dielectric upper surface, the amount of polishing that takes place in a given location is highly dependent on the underlying metal topology. In those areas where a narrow interconnect line (on the order of 10 microns) runs across a wide field region (on the order of 1-10 mm), the interlayer dielectric can become dramatically thinned as compared to those regions where the metal width is considerably wider (e.g., 1-10 mm). In some instances, thinning of the dielectric can reach a point where the underlying metal 1 trace becomes exposed. Most often, the thickness variation problem results in a via depth differential which makes via etching and via filling (i.e., with metal 2) more difficult. Having a dielectric thickness which is dependent upon topology also hinders circuit design and simulation efforts.

As will be seen, the present invention provides a polishing process for improving the degree of planarization attainable in a dielectric layer formed over a semiconductor substrate.

SUMMARY OF THE INVENTION

An improved method for planarizing the surface of a dielectric layer in a semiconductor process is disclosed. In one embodiment of the present invention, a dielectric layer is planarized by first positioning a semiconductor substrate face down on a table which has been coated with an abrasive material. The substrate is pressed down against the table so that the surface of the interlayer dielectric intimately contacts the abrasive. Rotational movement of the substrate relative to the table facilitates removal of the protruding portions of the interlayer dielectric by the abrasive.

Post-planarization feature height variation is minimized by simultaneously cooling the table and the abrasive material during the abrading or polishing process. By maintaining the table in a temperature range substantially below room temperature, the step height variation can be reduced by a factor of 2 over that normally realized by prior art methods.

In other embodiments, the invented process may be utilized to planarize a dielectric deposited over a polysilicon gate member, and/or the field oxide topography underlying a metal interconnect.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a cross-sectional view of a substrate following planarization according to a prior art polishing method.

FIG. 2 illustrates the polishing apparatus utilized in accordance with the currently preferred embodiment of the present invention.

FIG. 3 is a cross-sectional view of the substrate of a semiconductor substrate following deposition of an interlayer dielectric.

FIG. 4 is a cross-sectional view of the substrate of FIG. 3 following planarization according to the method of the present invention.

FIG. 5 is a plot of step height ratio (SHR) and polish rate versus temperature for a dielectric layer planarized according to the currently preferred embodiment of the present invention.

FIG. 6 is a top view of the apparatus of FIG. 2 illustrating the relative motions of the carrier and table during the planarization process.

DESCRIPTION OF THE PREFERRED EMBODIMENT(S)

A process for planarizing a dielectric layer formed over a semiconductor substrate is disclosed. In the following description, numerous specific details are set forth, such as specific material types, thicknesses, temperatures, etc., in order to provide a thorough understanding of the invention. It will be obvious, however, to one skilled in the art that these specific details need not be used to practice the present invention. In other instances, other well-known structures and processing steps have not been described in particular detail in order to avoid unnecessarily obscuring the present invention.

Referring to FIG. 1, there is shown a cross-sectional view of a semiconductor substrate 5 following planarization of an interlayer dielectric 3 in accordance with a conventional polishing method. Ideally, a perfectly planarized dielectric would have a surface contour which follows the dashed line 4. However, because of the differing widths of metal 1 traces 6 and 7 and their surrounding regions, the thickness of layer 3 is substantially thinned in the region above metal line 7 as compared to the region above metal line 6. In FIG. 1 this is illustrated by the relative thicknesses 9 and 8 of dielectric 3 over lines 6 and 7, respectively, wherein thickness 9 is greater than thickness 8. As explained above, this variation in dielectric thickness is highly dependent upon the overall topology of the underlying metal 1 interconnects.

With reference to FIG. 2, there is illustrated a polishing apparatus for planarization of a dielectric layer in accordance with the present invention. During planarization, a semiconductor substrate 23 is placed face down on a table 20. The table 20 includes a pad 21 fixedly attached to its upper surface. Pad 21 normally comprises a porous material which contacts the upper surface of the interlayer dielectric formed on substrate 23. The pad material is capable of absorbing particulate matter such as silica or other abrasive materials. In the currently preferred embodiment of the invented process, a polyurethane pad manufactured by Rodel, Inc., known by the name "SUBA 500", is employed.

A carrier 24, also known as a "quill", is used to apply a downward pressure $F_1$ against the backside of substrate 23. The backside of substrate 23 is held in contact with the bottom of carrier 24 by a vacuum or simply by wet surface tension. Preferably, an insert pad 30 cushions wafer 23 from carrier 24. An ordinary retaining ring 29 is employed to prevent wafer 23 from slipping laterally from beneath carrier 24. The applied pressure $F_1$ is typically on the order of 5 pounds per square inch and is applied by means of a shaft 27 attached to the backside of carrier 24. This pressure is used to facilitate abrasive polishing of the upper surface of the interlayer dielectric.

During operation, the carrier 24 typically rotates at approximately 36 rpms in a circular motion relative to table 20. This rotational movement is commonly provided by coupling an ordinary motor to shaft 27. In the currently preferred embodiment, the table also rotates at about 36 rpms in the same direction relative to the movement of the substrate. Again, the rotation of table 20 is achieved by well-known mechanical means. Abrasive polishing continues in this manner until a highly planar upper dielectric surface is produced.

FIG. 6 shows a top view of the polishing apparatus of FIG. 2 in which the relative rotational movements of carrier 24 and table 20 are indicated by arrows 34 and 35, respectively. Note that in the currently preferred embodiment, carrier 24 remains in a stationary position relative to the center 40 of table 20. The portion of the pad surface (i.e., pad 21 covering table 20) utilized during polishing is depicted by path 41 in FIG. 6. It is appreciated that alternative embodiments may employ different means for moving substrate 23 relative to table 20 without departing from the spirit or scope of the present invention.

The apparatus of FIG. 2 further includes an ordinary refrigeration unit 35 for chilling a coolant as it flows through pipe 32. Pipe 32 passes through the interior of table 20 so that the temperature of table 20 may be reduced below room temperature during the polishing process. In the currently preferred embodiment, the coolant comprises ordinary water whose temperature is controlled by refrigeration unit 35 so that the temperature of table 20 is maintained at approximately 10 degrees Celsius throughout the polishing process. Unit 35 also provides the means by which the coolant is circulated through pipe 32 and table 20. In other embodiments, other types of coolants and/or other refrigeration schemes may be employed without departing from the spirit and scope of the present invention.

The apparatus of FIG. 2 further includes a pipe 36 for delivering the abrasive material onto the surface of pad 21 during polishing. The abrasive is preferably delivered in a liquid suspension called a "slurry" to facilitate the polishing process. After being pumped thorough pipe 36, the slurry is directed onto the surface of pad 21 by nozzle 38.

The abrasive slurry is likewise chilled by refrigeration unit 35 utilizing heat exchanger 26. Heat exchanger 26 thermally couples pipes 33 and 36 together so that the slurry passing through pipe 36 is maintained at the same temperature as that of the coolant flowing through pipe 33. In other words, the coolant circulating in pipe 33 is also used to chill the slurry flowing in pipe 36. It is appreciated that exchanger 26 may comprise any material or device which is capable of efficient transfer of thermal energy between pipes 36 and 33.

Referring now to FIG. 3, a cross-sectional view of a substrate 10 is shown immediately following deposition of an interlayer dielectric 14. FIG. 3 illustrates dielectric 14 before planarization. Substrate 10 has assorted metal interconnects, e.g., 11 and 12, patterned across its surface. These metal interconnects provide electrical connection between the individual devices of the integrated circuit. Interlayer dielectric 14 normally comprises a CVD layer of silicon dioxide.

Note that the topology of the upper surface of dielectric 14 corresponds to the underlying metal interconnect features. The result is that the upper surface of dielectric 14 is characterized by a series of step height variations. The pre-polish step height is denoted in FIG. 3 by dimension 17. The magnitude of step height 17 is the same as the height of metal interconnects 11 and 12 (e.g., approximately 1 micron).

Referring now to FIG. 4, a cross-sectional view of the substrate of FIG. 3 is shown following planarization in accordance with the present invention. Observe that a post-polish height difference 18 exists due to the differing widths of metal lines 11 and 12 and their surrounding spaces. A perfectly planarized dielectric is denoted by the dashed line 19. As shown, dielectric removal is generally enhanced in those regions where the underlying metal interconnect is relatively narrow and isolated in a large space or an equivalently low metal density region. Due to the fact that metal interconnect line 12 is much narrower than metal line 11, a graded depression zone is produced in dielectric 14 above line 12. This depression zone gives rise to height variation 18 along the upper surface of dielectric 14. Difference 18 is an indication of how far the planarization process has deviated from the ideal (represented by line 19) due to the underlying topology of the metal 1 interconnects.

A measure of the effectiveness of the planarization process is given by the ratio of the post-polish height 18 to the pre-polish height 17. Mathematically this is expressed as:

$$\text{Step Height Ratio (SHR)} = \frac{\text{Post-Polish Height}}{\text{Pre-Polish Height}}$$

In the prior art, SHR typically was in the range of 0.5 to a 1.0; meaning that the post-polish height variation 18 generally ranged between 0.5 and 1.0 microns. As previously explained, this large thickness variation in the intermetal dielectric causes considerable processing problems. In comparison, the present invention is capable of reducing SHR down to approximately 0.25. (These numbers are representative of conventional measurements taken on a large pattern test device wherein metal line 11 is on the order of 10 mm wide, metal line 12 is about 1 micron wide and the spacing between metal line 12 and the nearest metal line 11 is on the order of 10 mm wide). Obviously, SHR results can vary significantly depending on the particular pattern used and the relative sizes of the metal lines and spacings. For example, if the space between metal lines 11 and 12 is <<1 mm, then virtually any polishing process can obtain a SHR near zero. Therefore, these SHR numbers are furnished only as an indication that the present invention improves SHR in integrated circuits; especially in situations involving relatively wide metal 1 widths and spacings (e.g., ~10 mm.)

To achieve such a low SHR level, the present invention relies on cooling table 20 and the abrasive slurry deposited onto the surface of pad 21 by means of refrigeration unit 35. Basically, in order to achieve a low SHR level the table and the abrasive material must be kept substantially below room temperature. This is accomplished in the currently preferred embodiment utilizing ordinary refrigerator coils and a heat exchanging element. Alternative embodiments may employ a variety of other cooling mechanisms. By way of example, the entire planarization apparatus—including the carrier, pad, substrate and table—may all be enclosed within a refrigeration chamber to achieve similar results.

FIG. 5 shows a plot of SHR and polish rate versus temperature. As is clearly illustrated, the step height variation is radically reduced by lowering the temperature of table 20. At the preferred temperature of 10° C., a step height ratio of 0.25 is produced. Note that the reduction in temperature has no appreciable affect on the polish rate—the polish rate at 10° C. is approximately 2250 Å per minute compared to approximately 2300 Å per minute at 40° C. (The data for FIG. 5 was obtained from six wafers wherein five sites per wafer were measured at each temperature).

Cooling table 20 during planarization processing also improves uniformity both across the wafer and from wafer-to-wafer as indicated by Table 1 below:

TABLE 1

|  | Uniformity Cross Wafer | Uniformity Wafer to Wafer |
| --- | --- | --- |
| 10° C. | 9.5% | 5.9% |
| 23° C. | 12.2% | 9.3% |
| 40° C. | 13.2% | 14.8% |

Although the present invention has been described in conjunction with the planarization of an intermetal dielectric layer (i.e., between metal 1 and metal 2), it is appreciated that the present invention is not limited to just this use. For instance, the invented process is also useful for planarizing other dielectric layers, e.g., a field oxide or a polysilicon-gate dielectric in a process for forming field-effect transistors.

Therefore, it is to be understood that the particular embodiments shown and described by way of illustration are in no way intended to be considered limiting. Reference to the details of the preferred embodiment is not intended to limit the scope of the claims which themselves recite only those features regarded as essential to the invention.

Thus, an improved method for planarizing the surface of a dielectric deposited over a semiconductor substrate has been described.

What is claimed is:

1. In a semiconductor process, a method for planarizing the surface of a dielectric deposited on a substrate comprising the steps of:

positioning said substrate on a table coated with an abrasive;

pressing said substrate against said table such that said surface of said dielectric contacts said abrasive;

moving said substrate relative to said table to facilitate planarization of said dielectric by said abrasive; and simultaneously cooling said table to a temperature substantially below room temperature to minimize thickness variations in said dielectric.

2. The method according to claim 1 wherein said moving step comprises the steps of rotating said substrate relative to said table; and rotating said table relative to said substrate.

3. The method of claim 2 wherein said dielectric comprises silicon dioxide.

4. The method according to claim 1 wherein said cooling step comprises the step of flowing a refrigerated coolant through said table.

5. In a semiconductor process, a method for planarizing a dielectric deposited on a silicon substrate comprising the steps of:

positioning said substrate on a table;

pressing said substrate against said table such that said dielectric contacts the surface of said table;

delivering an abrasive material to said surface of said table;

moving said substrate over said surface of said table to allow said abrasive material to wear away portions of said dielectric by friction, thereby resulting in a substantially planar dielectric material; and simultaneously cooling said table during said moving step and cooling said abrasive material as said material is delivered to said surface of said table.

6. The method according to claim 5 wherein said table and said abrasive material are both cooled to a temperature which is substantially below room temperature.

7. The method according to claim 5 wherein said table and said abrasive material are both cooled to a temperature of approximately 10° C.

8. The method of claim 7 wherein said dielectric comprises silicon dioxide.

9. The method according to claim 5 wherein said cooling step comprises the steps of:
flowing a refrigerated coolant through said table and a heat exchanging element;
flowing said abrasive material through said heat exchanging element prior to said delivering step such that said coolant absorbs the thermal energy of said material through said exchanger, thereby cooling said material.

10. In a semiconductor process which includes the steps of:
forming metal interconnects across a substrate surface; and
depositing an interlayer dielectric over said metal interconnects, said interlayer dielectric having an upper surface whose topology varies in height in correspondence with said underlying metal interconnects; an improved method of planarizing said upper surface of said interlayer dielectric comprising the steps of:
placing said substrate on a table coated with an abrasive such that said upper surface of said inner layer dielectric contacts said abrasive;
rotating said substrate with respect to said table;
simultaneously pressing said substrate against said table to facilitate the removal of portions of said upper surface of said interlayer dielectric by said abrasive; and
cooling said table and said abrasive to a temperature substantially below room temperature during said rotating and said pressing steps.

11. The method according to claim 10 wherein said temperature in said cooling step is approximately 10° C.

12. The method according to claim 11 wherein said interlayer dielectric comprises silicon dioxide.

13. The method according to claim 12 wherein said cooling step comprises flowing a liquid coolant through said table.

* * * * *